United States Patent
Fujiwara

(10) Patent No.: US 6,222,213 B1
(45) Date of Patent: Apr. 24, 2001

(54) SEMICONDUCTOR INTEGRATED CIRCUIT DEVICE

(75) Inventor: Makoto Fujiwara, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/336,781

(22) Filed: Jun. 21, 1999

(30) Foreign Application Priority Data

Jun. 29, 1998 (JP) .................................................. 10-181885

(51) Int. Cl.[7] ........................... H01L 27/02; H01L 27/10; H01L 23/48
(52) U.S. Cl. ........................... 257/210; 257/203; 257/207; 257/499; 257/784; 257/202
(58) Field of Search ..................................... 257/210, 203, 257/207, 499, 211, 208, 784, 786, 212

(56) References Cited

U.S. PATENT DOCUMENTS

| 4,731,643 | 3/1988 | Dunham et al. . |
|---|---|---|
| 4,746,966 | 5/1988 | Fitzgerald et al. . |
| 5,023,689 | 6/1991 | Sugawara . |
| 5,292,687 | 3/1994 | Isozaki . |
| 5,300,796 | * 4/1994 | Shintani ............................. 257/203 |
| 5,641,978 | * 6/1997 | Jassowski ............................. 257/203 |
| 6,091,089 | * 7/2000 | Hiraga ............................. 257/203 |

FOREIGN PATENT DOCUMENTS

| 61-150259 | 7/1986 | (JP) . |
|---|---|---|
| 4368175 | 12/1992 | (JP) . |
| 5102442 | 4/1993 | (JP) . |

* cited by examiner

Primary Examiner—Alexander O. Williams
(74) Attorney, Agent, or Firm—Stevens, Davis, Miller & Mosher, LLP

(57) ABSTRACT

In order that an internal logic circuit area and an outside input/output cell group are easily connected, a plurality of input/output cell groups for performing signal transfer with an external device are each arranged in a square loop so that the internal logic circuit area is surrounded by a plurality of loops. In each of the inside and the outside input/output cell groups, bonding pads are provided, and square-loop-shaped power supply wiring having an input/output element and protecting element formed area formed therein and functioning as a guard band is disposed on the internal logic circuit area side of the bonding pad. The input/output cells of the inside input/output cell group are arranged in a condition where a first space for providing wiring between the internal logic circuit area and the outside input/output cell group is provided. The inside input/output cell group and the outside input/output cell group are disposed in a condition where the first space for providing wiring between the internal logic circuit area and the outside input/output cell group is provided.

8 Claims, 12 Drawing Sheets

SEMICONDUCTOR INTEGRATED CIRCUIT DEVICE

BACKGROUND OF THE INVENTION

1. Field of the Invention

This invention relates to the arrangement and structure of the input/output cells in a semiconductor device, particularly, in a semiconductor integrated circuit device.

2. Description of the Prior Art

FIG. 7 is a schematic view of a conventional semiconductor integrated circuit device. This semiconductor integrated circuit device has an internal logic circuit area 31 and two input/output cell groups 10 and 20 on a semiconductor substrate (not shown). The internal logic circuit area 31 is designed so as to have an arbitrary function. Signal wiring is provided between the two input/output cell groups 10 and 20 and the internal logic circuit area 31 or between the input/output cells of the input/output cell group 10 and the input/output cells of the input/output cell group 20 so that signal transfer is performed between the internal logic circuit area 31 and an external device (not shown) through the two input/output cell groups 10 and 20.

The two input/output cell groups 10 and 20 comprise a plurality of input/output cells 11 and 21, respectively. The input/output cells 11 and 21 are each arranged in a square loop so that the square internal logic circuit area 31 is surrounded by two loops.

The inside input/output cell group 10 comprises a multiplicity of input/output cells 11 and four corner cells 11A comprising blank cells. The cells are arranged in a square loop on the semiconductor substrate so as to surround the square internal logic circuit area 31 situated substantially in the center of the semiconductor substrate. The outside input/output cell group 20 comprises a multiplicity of input/output cells 21 and four corner cells 21A comprising blank cells. The cells are arranged in a square loop so as to surround the inside input/output cell group 10.

A space 41 for providing wiring between the internal logic circuit area 31 and the outside input/output cell group 20 is provided between the inside input/output cell group 10 and the outside input/output cell group 20. A space for providing wiring is also provided between the internal logic circuit area 31 and the inside input/output cell group 10.

The input/output cells 11 of the inside input/output cell group 10 each have a high potential side guard band 12, a low potential side guard band 13 and a bonding pad 14. The high potential side guard band 12 is disposed on the side closer to the internal logic circuit area 31. The low potential side guard band 13 is disposed outside the high potential side guard band 12. The bonding pad 14 is disposed outside the low potential side guard band 13. The high potential side guard band 12 is supplied with a high potential supply voltage $V_{DD}$, whereas the low potential side guard band 13 is supplied with a low potential supply voltage $V_{SS}$. The bonding pad 14 is connected to an external device to perform signal transfer with the external device.

The input/output cells 21 of the outside input/output cell group 20 each have a high potential side guard band 22, a low potential side guard band 23 and a bonding pad 24. The high potential side guard band 22 is disposed on the side closer to the internal logic circuit area 31. The low potential side guard band 23 is disposed outside the high potential side guard band 22. The bonding pad 24 is disposed outside the low potential side guard band 23. The high potential side guard band 22 is supplied with the high potential supply voltage $V_{DD}$, whereas the low potential side guard band 23 is supplied with the low potential supply voltage $V_{SS}$. The bonding pad 24 is connected to an external device to perform signal transfer with the external device.

The corner cells 11A have no guard bands. The corner cells 21A each have a low potential side guard band 23A electrically connected to the low potential side guard band 23.

On the semiconductor substrate, wiring 51 as, for example, signal lines is provided. The wiring 51 made of a metal such as aluminum or copper electrically connects the internal logic circuit area 31 and the outside input/output cells 21.

The input/output cells 11 and 21 are incorporated in the semiconductor integrated circuit device in order to perform signal transfer with an external device. The input/output cells 11 and 21 include not only input/output elements but also elements for protecting the semiconductor integrated circuit device from externally applied high voltages such as noises and bonding pads 14 and 24 for performing signal transfer with an external device.

FIG. 8 shows an example of an equivalent circuit of the input/output cells 11. The input/output cells 11 each comprise, as shown in FIG. 8, a P-channel transistor 201 which is a P-channel input element, an N-channel transistor 202 which is an N-channel input element, a P-channel transistor 203 which is a P-channel output element, an N-channel transistor 204 which is an N-channel output element, a P-channel transistor 205 which is a P-channel protecting element, and an N-channel transistor 206 which is an N-channel protecting element.

The source of the P-channel transistor 201 is connected to the high potential supply voltage $V_{DD}$. The source of the N-channel transistor 202 is connected to the low potential supply voltage $V_{SS}$. The gate of the P-channel transistor 201 and the gate of the N-channel transistor 202 are joined and connected to the bonding pad 14. The drain of the P-channel transistor 201 and the drain of the N-channel transistor 202 are joined and connected to the internal logic circuit area 31.

The source of the P-channel transistor 203 is connected to the high potential supply voltage $V_{DD}$. The source of the N-channel transistor 204 is connected to the low potential supply voltage $V_{SS}$. The drain of the P-channel transistor 203 and the drain of the N-channel transistor 204 are joined and connected to the bonding pad 14. The gate of the P-channel transistor 203 and the gate of the N-channel transistor 204 are joined and connected to the internal logic circuit area 31.

The source and the gate of the P-channel transistor 205 are joined and connected to the high potential supply voltage $V_{DD}$. The source and the gate of the N-channel transistor 206 are joined and connected to the low potential supply voltage $V_{SS}$. The drain of the P-channel transistor 205 and the drain of the N-channel transistor 206 are joined and connected to the bonding pad 14.

The input/output cells 21 have the same circuit structure as the input/output cells 11.

Because of this circuit structure, the guard bands 12, 13, 22 and 23 are normally formed in the input/output cells 11 and 21, and by the guard bands 12, 13, 22 and 23, the input/output cells 11 and 21 are protected. By arranging the input/output cells 11 and 21 in loops, the guard bands 12, 13, 22 and 23 form rings surrounding the internal logical circuit area 31, whereby the internal logic circuit area 31 is protected. The rings formed by the guard bands 12, 13, 22 and 23 are called guard rings.

The elements for protecting the semiconductor integrated circuit device from externally applied high voltages are provided for the following purpose: Since external signals are directly supplied to the semiconductor integrated circuit device through the bonding pads 14 and 24, in order to protect the semiconductor integrated circuit device, an element is provided for causing an overcurrent to flow toward the high potential side when a high voltage is applied. In this case, toward the high potential side, the overcurrent is caused to flow from the drain of the P-channel transistor 205 which is a protecting element. Toward the low potential side, the overcurrent is caused to flow from the drain of the N-channel transistor 206 which is a protecting element.

By surrounding the portions where the overcurrent flows, for example, by the square-loop-shaped guard bands 12, 13, 22 and 23 and absorbing a trigger current which is a factor that causes latch up by the guard bands 12, 13, 22 and 23, the generation of latchup in the input/output cells 11 and 21 are prevented, whereby the input/output cells 11 and 21 are protected.

Further, by arranging the input/output cells 11 and 12 in loops so that the guard bands 12, 13, 22 and 23 surround the internal logic circuit area 31, the trigger current caused by noise or the like and flowing from the bonding pads 14 and 24 into the internal logic circuit area 31 to cause latchup is absorbed by the rings of the guard bands 12, 13, 22 and 23 to thereby prevent the generation of latchup in the internal logic circuit area 31, whereby the internal logic circuit area 31 is protected.

According to the conventional method of arranging the input/output cells in a semiconductor integrated circuit device, the wiring 51 connecting the internal logic circuit area 31 and the outside input/output cells 21 passes above the inside input/output cells 11. Describing concretely, polysilicon layers and aluminum wiring layers for forming transistors are present in the input/output cells 11. Therefore, the metal line of another layer that is not used in the input/output cells 11 is passed above the input/output cells 11. For example, when the input/output cells 11 use the aluminum wirings of the first and the second layers, the aluminum wiring of the third layer is used as the wiring 51. Moreover, it is necessary to form the bonding pad 14 on the layer above the layer whose wiring is used as the wiring 51.

FIG. 9 is a schematic view showing the layout of a typical input/output cell. As shown in FIG. 9, in the layout of the input/output cell, the bonding pad 14 for performing signal transfer with an external device is disposed in the lowermost part of the input/output cell 11, that is, the part situated outside when the input/output cells 11 are arranged in a loop, whereas the square-loop-shaped high potential side guard band 12 and the square-loop-shaped low potential side guard band 13 are formed above the bonding pad 14, that is, in a part situated inside when the input/output cells 11 are arranged in a loop. The high potential side guard band 12 is supplied with the high potential supply voltage $V_{DD}$. The low potential side guard band 13 is supplied with the low potential supply voltage $V_{SS}$.

In order that the trigger current flowing from the bonding pads 14 and 24 into the internal logic circuit area 31 to cause latchup is effectively absorbed, the bonding pads 14 and 24 are disposed on the outermost side of the input/output cells 10 and 20.

The high potential side guard bands 12 and the low potential side guard bands 13 are formed in square loops around a P-channel element and protecting element formed area 12A and an N-channel element and protecting element formed area 13A, respectively. This applies to the input/output cells 21.

While the guard bands 12 and 13 are each drawn as one line in FIG. 7, this is for simplification of the figure, and in actuality, the guard bands 12 and 13 each have a square loop shape as mentioned above. This applies to embodiments described later.

In fabricating a semiconductor integrated circuit device, for example, the input/output cells 11 are arranged in a square loop around the logical circuit area 31 as shown in FIG. 7, whereby the high potential side guard bands 12 and the low potential side guard bands 13 are electrically connected to form guard rings.

An example of a cross-sectional structure of the input/output cells 11 will be described with reference to FIG. 10. In FIG. 10, in the input/output cell 11, an $N^+$-type well 62 and a $P^+$-type well 63 are formed in a P-type semiconductor substrate 61.

In a peripheral part of the $N^+$-type well 62, a diffusion layer 64 for the high potential side guard band is formed in a square loop. On the diffusion layer 64, a metal layer 66 such as an aluminum layer for the high potential side guard band is formed in a square loop. The metal layer 66 is connected to the diffusion layer 64 by a contact. The diffusion layer 64 and the metal layer 66 correspond to the high potential side guard band 12 of FIG. 9.

In a peripheral part of the $P^+$-type well 63, a diffusion layer 65 for the low potential side guard band is formed in a square loop. On the diffusion layer 65, a metal layer 67 such as an aluminum layer for the low potential side guard band is formed in a square loop. The metal layer 67 is connected to the diffusion layer 65 by a contact. The diffusion layer 65 and the metal layer 67 correspond to the low potential side guard band 13 of FIG. 9.

A P-channel input/output element and protecting element formed area 68 surrounded by the high potential side guard band comprising the diffusion layer 64 and the metal layer 66 corresponds to the P-channel input/output element and protecting element formed area 12A. An N-channel input/output element and protecting element formed area 69 surrounded by the low potential side guard band comprising the diffusion layer 65 and the metal layer 67 corresponds to the N-channel input/output element and protecting element formed area 13A.

The P-channel input/output element and protecting element formed area 68 and the P-channel input/output element and protecting element formed area 69 are protected by a protecting film (SOG (spin on glass)) 70 formed on the surface of the P-type semiconductor substrate 61.

In FIG. 10, the P-channel elements and the N-channel elements formed in the N+-type well 62 and the P+-type well 63 (the P-channel transistors 201, 203 and 205 and the N-channel elements 202, 204 and 206 of FIG. 8) are not illustrated.

The guard bands basically have the two-layer structure of a diffusion layer and a metal layer as described above.

The difference between power supply wiring and the guard bands will be described. The power supply wiring, which is basically an aluminum layer, is a line connecting with the power supply line to which the power supply wiring is to be connected. On the contrary, the guard bands, although connecting with the power supply line, connect with a well potential (substrate potential) directly.

Next, the function of the guard bands will be described with reference to FIG. 11. FIG. 11 is a cross-sectional view of a part of the input/output cell. Parasitically formed elements are represented by circuit symbols. In FIG. 11, in the input/output cell, an N+-type well 82 is formed in a P-type semiconductor substrate 81. A P+-type diffusion layer 83 is formed in the N+-type well 82. The P+-type diffusion layer 83 serves as the drain of a P-channel MOS transistor as a P-channel output element. Moreover, a P+-type diffusion layer 84 is formed in the N+-type well 82. The P+-type diffusion layer 84 serves as the source of the above-mentioned P-channel MOS transistor. Further, a polysilicon layer 85 serving as the gate of the P-channel MOS transistor is formed above the N+-type well 82 in a position between the P+-type diffusion layers 83 and 84. Moreover, an N+-type diffusion layer 86 is formed in the N+-type well 82. The N+-type diffusion layer 86 is used for contact with the N+-type well 82. An N+-type diffusion layer 98 formed in the N+-type well 82 serves as the high potential side guard band, is supplied with the high potential supply voltage $V_{DD}$ and corresponds to the diffusion layer 64 of FIG. 10. A P+-type diffusion layer 99 formed in the P-type semiconductor substrate 81 serves as the low potential side guard band, is supplied with the low potential supply voltage $V_{SS}$ and corresponds to the diffusion layer 65 of FIG. 10.

On the other hand, a diffusion layer 87 is formed in the P-type semiconductor substrate 81. The N+-type diffusion layer 87 serves as the drain of an N-channel MOS transistor as an N-channel output element. An N+-type diffusion layer 88 is formed in the P-type semiconductor substrate 81. The N+-type diffusion layer 88 serves as the source of the above-mentioned N-channel MOS transistor. Further, a polysilicon layer 89 serving as the gate of the N-channel MOS transistor is formed above the P-type semiconductor substrate 81 in a position between the N+-type diffusion layers 87 and 88. Moreover, a P+-type diffusion layer 90 is formed in the P-type semiconductor substrate 81. The P+-type diffusion layer 90 is used for contact with the P-type semiconductor substrate 81.

The N+-type well 82 corresponds to the N+-type well 62 of FIG. 10. A P+-type well corresponding to the P+-type well 63 of FIG. 10 is not shown. The P+-type well is not always necessary.

An output terminal 91 for obtaining an output $V_{OUT}$ is connected to the P+-type diffusion layer 83 and the N+-type diffusion slayer 87. A high potential power supply wiring 92 is connected to the P+-type diffusion layer 84 and the N+-type diffusion layer 86, and is supplied with the high potential supply voltage $V_{DD}$. A low potential power supply wiring 93 is connected to the N+-type diffusion layer 88 and the P+-type diffusion layer 90, and is supplied with the low potential supply voltage $V_{SS}$.

In the input/output cell of the above-described structure, for example, PNP-type parasitic transistors 94 and 95, NPN-type parasitic transistors 96 and 97, and parasitic resistors $r_1$, $r_2$, $r_3$ and $r_4$ are present.

In the above-described structure, for example, when a high voltage is applied to the output terminal 91 by the high potential supply voltage $V_{DD}$, a trigger current is supplied as the emitter current from the output terminal 91 to the parasitic transistor 94 in a forward direction. Then, the collector current of the parasitic transistor 94 flows to the P-type semiconductor substrate 81. This causes latchup.

On the contrary, the trigger current can be absorbed by disposing the guard band in the vicinity of the portion where the trigger current is generated, whereby the amount of latchup resistance is improved.

FIG. 12 shows the parasitic transistors 95 and 97 and the parasitic resistors $r_1$, $r_2$, $r_3$ and $r_4$ in the CMOS circuit of FIG. 11. The transistors 95 and 97 and the resistors $r_1$ to $r_4$ form a thyristor structure, and latchup occurs in this portion. In FIG. 12, by reducing the parasitic resistors (base resistors) $r_1$ and $r_4$ by applying the high potential supply voltage $V_{DD}$ to the base of the parasitic transistor 95 and applying the low potential supply voltage $V_{SS}$ to the base of the parasitic transistor 96 as shown by the broken lines by use of the guard band, the latchup can be restrained.

For semiconductor integrated circuit devices, the technology to increase the speed, the degree of integration and the number of pins has advanced year by year. In the advancement of the technology, as the degree of integration and the number of pins have increased, the influence of the chip size because of the size of the input/output circuit has become a problem. This is because, as described above, the input/output circuit cannot be increased in degree of integration as much as the internal element since the circuit for protecting the semiconductor integrated circuit device from externally applied high voltages (noises, etc.) is incorporated in the input/output circuit.

For this reason, in a semiconductor integrated circuit device having an increased number of pins, a multiplicity of input/output circuits are disposed, so that the chip size depends on the input/output circuits.

Therefore, in order to reduce the chip size, the input/output cell groups are arranged in a plurality of loops as shown in the conventional example. However, when the input/output cell groups are arranged in a plurality of loops, since there is an input/output cell group inside, it is difficult to connect the outside input/output cell group and the internal logic circuit area.

SUMMARY OF THE INVENTION

An object of the invention is to provide a semiconductor integrated circuit device in which the internal logic circuit area and the outside input/output cell group can easily be connected.

This invention solves the above-mentioned problem by adding a twist to the arrangement of the input/output cells in the semiconductor integrated circuit device. Hereinafter, means will be described.

In a semiconductor integrated circuit device of this invention, a plurality of, that is, at least two input/output cell groups each comprising a plurality of input/output cells for performing signal transfer with an external device are each arranged in a loop so that an internal logic circuit area is surrounded by a plurality of, that is, at least two loops.

In the semiconductor integrated circuit device, a bonding pad for performing signal transfer with the external device is provided in each of the input/output cells of the inside and the outside input/output cell groups of the plurality of input/output cell groups. First guard bands are disposed on the internal logic circuit area side of the bonding pad in each of the input/output cells of the inside input/output cell group. The input/output cells of the inside input/output cell group are arranged in a condition where a first space for providing wiring between the internal logic circuit area and the input/output cells of the outside input/output cell group is provided. The inside input/output cell group and the outside input/output cell group are arranged in a condition where a second space for providing wiring between the internal logic circuit area and the input/output cells of the outside input/output cell group is provided.

That is, in order to provide wiring for connecting the internal logic circuit area and the input/output cells of the outside input/output cell group, the input/output cells of the inside input/output cell group are arranged so that a space is formed at given intervals, whereby the first space for connecting the internal logic circuit area and the input/output cells of the outside input/output cell group is secured. Moreover, the inside input/output cell group and the outside input/output cell group are arranged so that a space is also formed between the outside and the inside input/output cell groups, whereby the second space for providing wiring between the outside input/output cell group and the inside input/output cell group is secured.

According to this structure, the wiring for connecting the internal logic circuit area and the input/output cells of the outside input/output cell group can be provided through the first and the second spaces, so that the internal logic circuit area and the input/output cells of the outside input/output cell group can easily be connected. Moreover, the internal logic circuit area can be protected from high voltages (noises, etc.) by the guard bands.

In the above-described semiconductor integrated circuit device, it is preferable that a blank cell having second guard bands each comprising only a diffusion layer be disposed in the first space. According to this structure, closed guard rings for the internal logic circuit area are formed by the first guard bands of the inside input/output cell group and the second guard bands.

Even if the guard rings are partly open, it is basically possible to protect the internal logic circuit area from noises. However, in order to stabilize the supply voltage in the vicinity of a noise source, that is, in order to sufficiently absorb noises, restrain latchup and improve the function of protecting the internal logic circuit area, it is preferable that the guard rings be closed.

According to this structure, latchup caused by a noise current flowing from the bonding pad into the internal logic circuit area can be eliminated by the closed guard rings. Consequently, the capability of protecting the internal logic circuit area can be improved. In addition, since the second guardbands each comprise only a diffusion layer, the second guard bands never interfere with wiring.

In the above-described semiconductor integrated circuit device, it is preferable that third guard bands be disposed on an internal logic circuit area side of the bonding pad in each of the input/output cells of the outside input/output cell group.

According to this structure, since guards bands are provided in each of the inside and outside input/output cell groups, latchup in the outside input/output cell group can be restrained by the third guard bands, so that the capability of protecting the internal logic circuit area can be improved.

Further, in the semiconductor integrated circuit device provided with the third guard bands, a fourth guard band may be provided on an opposite side to the internal logic circuit area side of the bonding pad in each of the input/output cells of the inside input/output cell group.

According to this structure, in a case where a second internal logic circuit area is formed between the inside input/output cell group and the outside input/output cell group, latchup caused by a current flowing from the bonding pad of each input/output cell of the inside input/output cell group into the second internal logic circuit area can be restrained. Consequently, the second internal logic circuit area can be protected.

Moreover, since the second guard bands each comprise only a diffusion layer in order to pass wiring therethrough, the resistance is high compared to connection by a metal which is a wiring layer. Therefore, by providing the fourth guard band between the bonding pad of the inside input/output cell and the second guard bands, latchup caused by a noise current flowing into the internal logic circuit area can further be restrained.

Moreover, it is preferable that the fourth guard band be formed so as to surround the bonding pad.

According to this structure, since the fourth guard band surrounds the bonding pad, latchup caused by a current flowing from the bonding pad of each input/output cell of the inside input/output cell group into the second internal logic circuit area can be restrained. Consequently, the capability of protecting the second internal logic circuit area can further be improved.

Moreover, latchup caused by a noise current flowing into the internal logic circuit area can still further be restrained.

As described above, according to the semiconductor integrated circuit device of this invention, in a semiconductor integrated circuit device in which input/output cells are arranged in a plurality of loops, wiring between the outside input/output cell group and the internal logic circuit area can easily be provided.

Moreover, for the rings of the first guard bands which are opened by arranging the input/output cells at given intervals, by disposing blank cells having the second guard bands comprising only diffusion layers in the spaces between the input/output cells, the guard bands are easily formed in closed rings. Consequently, the protecting capability can be improved. In addition, the blank cells never interfere with the wiring between the internal logic circuit area and the outside input/output cell group.

Moreover, by providing the third guard bands on the internal logic circuit area side of the bonding pad of each outside input/output cell and providing the fourth guard band outside the bonding pad of each inside input/output cell, when a second internal logic circuit area is formed in the space between the outside and the inside input/output cell groups, the second internal logic circuit area can be protected.

DESCRIPTION OF THE PREFERRED EMBODIMENTS (First Embodiment, Corresponding to Claim 1)

Figure 1:
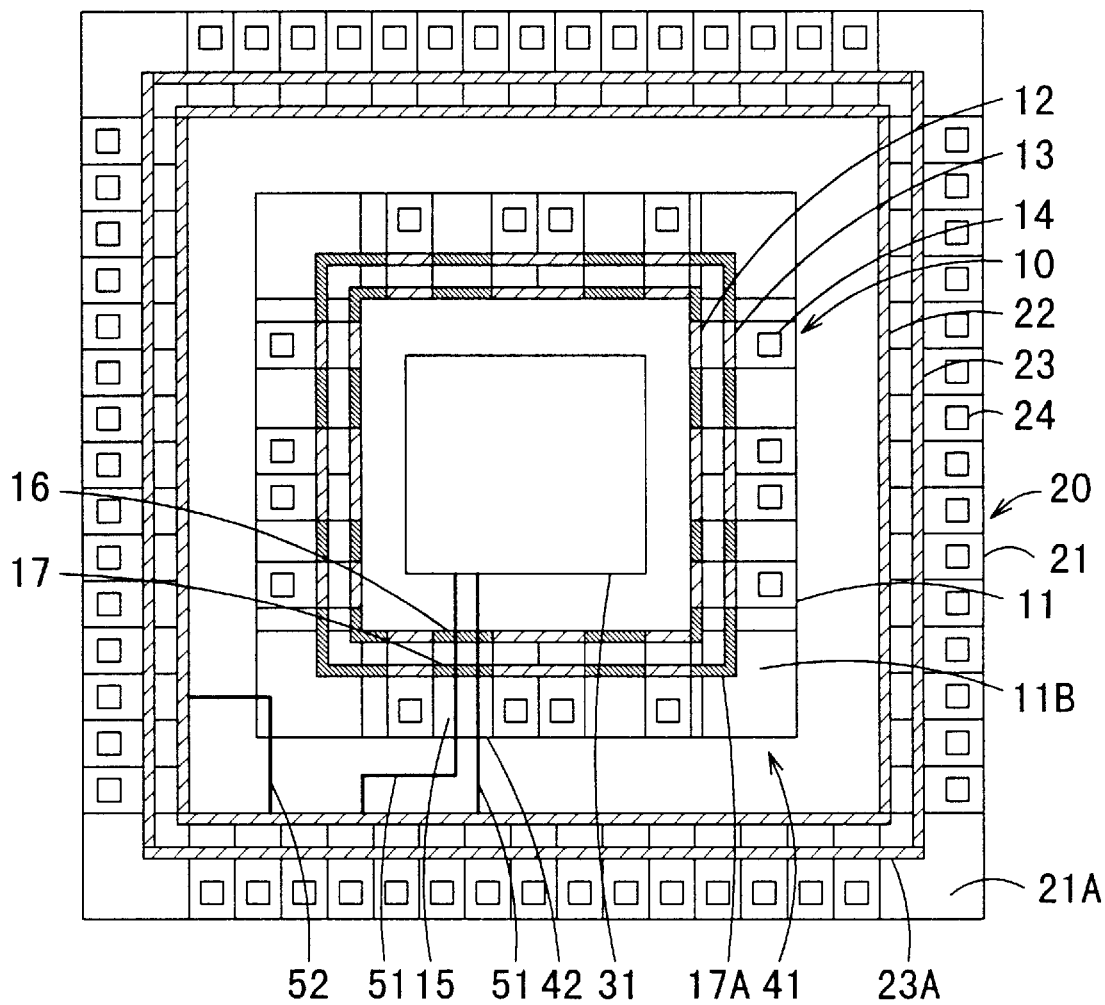
FIG. 1 is a schematic view showing the structure of a semiconductor integrated circuit device according to a first embodiment of the invention.

FIG. 1 is a schematic view of a semiconductor integrated circuit device according to a first embodiment of the invention. In this semiconductor integrated circuit device, two input/output cell groups each comprising a plurality of input/output cells for performing signal transfer with an external device are each arranged in a square loop so that the internal logic circuit area is surrounded by a plurality of loops, in this embodiment, by two loops. The difference from the conventional example is that some of the cells of the inside input/output cell group are not input/output cells but blank cells. Except this, the structure is the same as that of the conventional example. A detailed description will hereinafter be given.

As shown in FIG. 1, the inside input/output cell group 10 is arranged in a square loop and comprises a multiplicity of input/output cells 11, four corner cells (blank cells) 11B and blank cells 15. The outside input/output cell group 20 is disposed in a square loop and comprises a multiplicity of input/output cells 21 and four corner cells (blank cells) 21A, which is the same as that of the conventional example.

The internal logic circuit area 31 is formed inside the inside input/output cell group 10. Like in the conventional example, a space 41 is provided for wiring between the internal logic circuit area 31 and the outside input/output cell 21.

The high potential side guard band 12 is provided in each of the inside input/output cells 11, is supplied with the high potential supply voltage $V_{DD}$, and has the two-layer structure of a diffusion layer and an aluminum layer like that of the conventional example. The low potential side guard band 13 is provided in each of the inside input/output cells 11, is supplied with the low potential supply voltage $V_{SS}$, and has the two-layer structure of a diffusion layer and an aluminum layer like that of the conventional example.

The high potential side guard band 22 is provided in each of the outside input/output cells 21, is supplied with the high potential supply voltage $V_{DD}$, and has the two-layer structure of a diffusion layer and an aluminum layer like that of the conventional example. The low potential side guard band 23 is provided in each of the outside input/output cells 21, is supplied with the low potential supply voltage $V_{SS}$, and has the two-layer structure of a diffusion layer and an aluminum layer like that of the conventional example.

The bonding pad 14 is provided in each of the inside input/output cells 11 like that of the conventional example, and performs signal transfer with an external device. The bonding pad 24 is provided in each of the outside input/output cells 21 like that of the conventional example, and performs signal transfer with an external device.

The wiring 51 as signal lines is made of aluminum wiring or the like, and is disposed between the internal logic circuit area 31 and the outside input/output cells 21. Wiring 52, also made of aluminum wiring or the like, is disposed between the outside input/output cells 21. These wirings pass above high potential side guard bands 16 and low potential side guard bands 17 provided in the blank cells 15. A space 42 is provided in the inside input/output cell group 10 for providing wiring between the internal logic circuit area 31 and the outside input/output cells 21, and the blank cells 15 are formed in the space 42.

As described above, the blank cells 15 are formed in the space 42. In each blank cell 15, the high potential side guard band 16 and the low potential side guard band 17 each comprising only a diffusion layer are formed. In each corner cell 11B, a guard band 17A comprising only a diffusion layer is formed. In each corner cell 21A, a guard band 23B having the two-layer structure of a diffusion layer and an aluminum layer is formed.

The high potential side guard bands 16 and the low potential side guard bands 17 are electrically connected to the high potential side guard bands 12 and the low potential side guard bands 13 to form guard rings, respectively. The guard rings have a closed structure in order to stabilize the supply voltage in a vicinity of a noise source. Even if the guard rings are partly open, it is basically possible to protect the internal logic circuit area 31 from noises.

Figure 9:
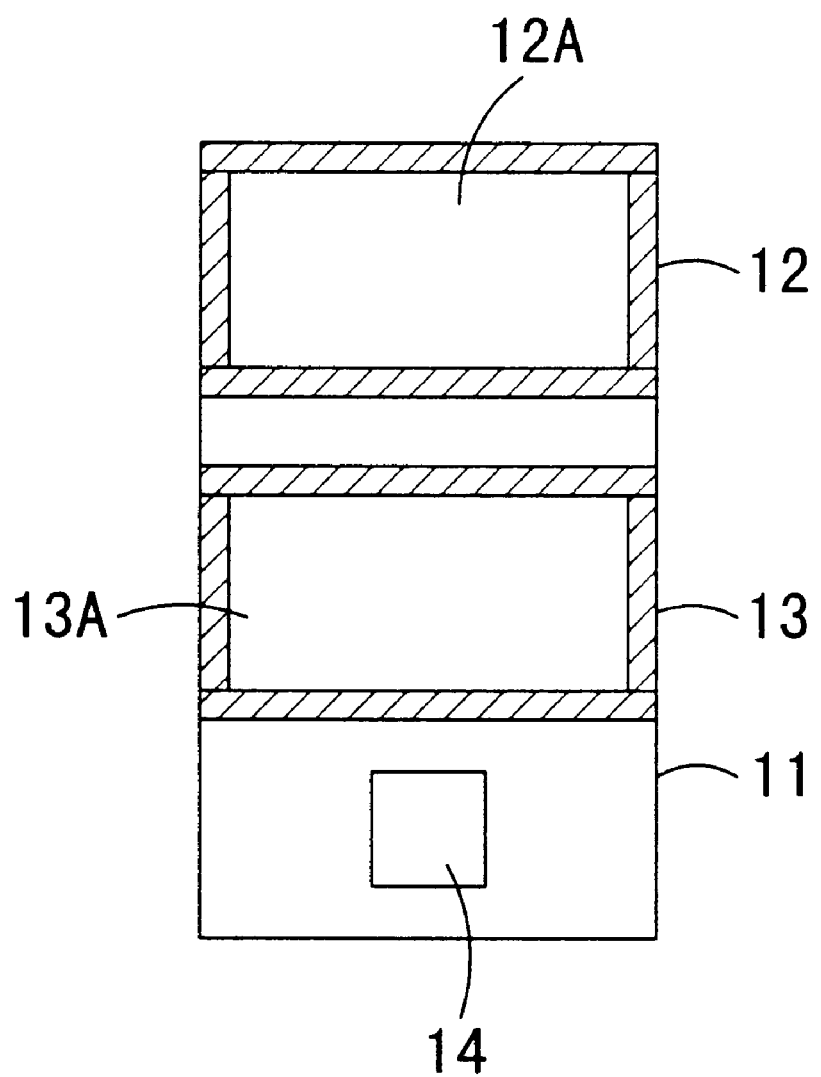
FIG. 9 is a schematic view showing the structure of the conventional input/output cell.
Figure 10:
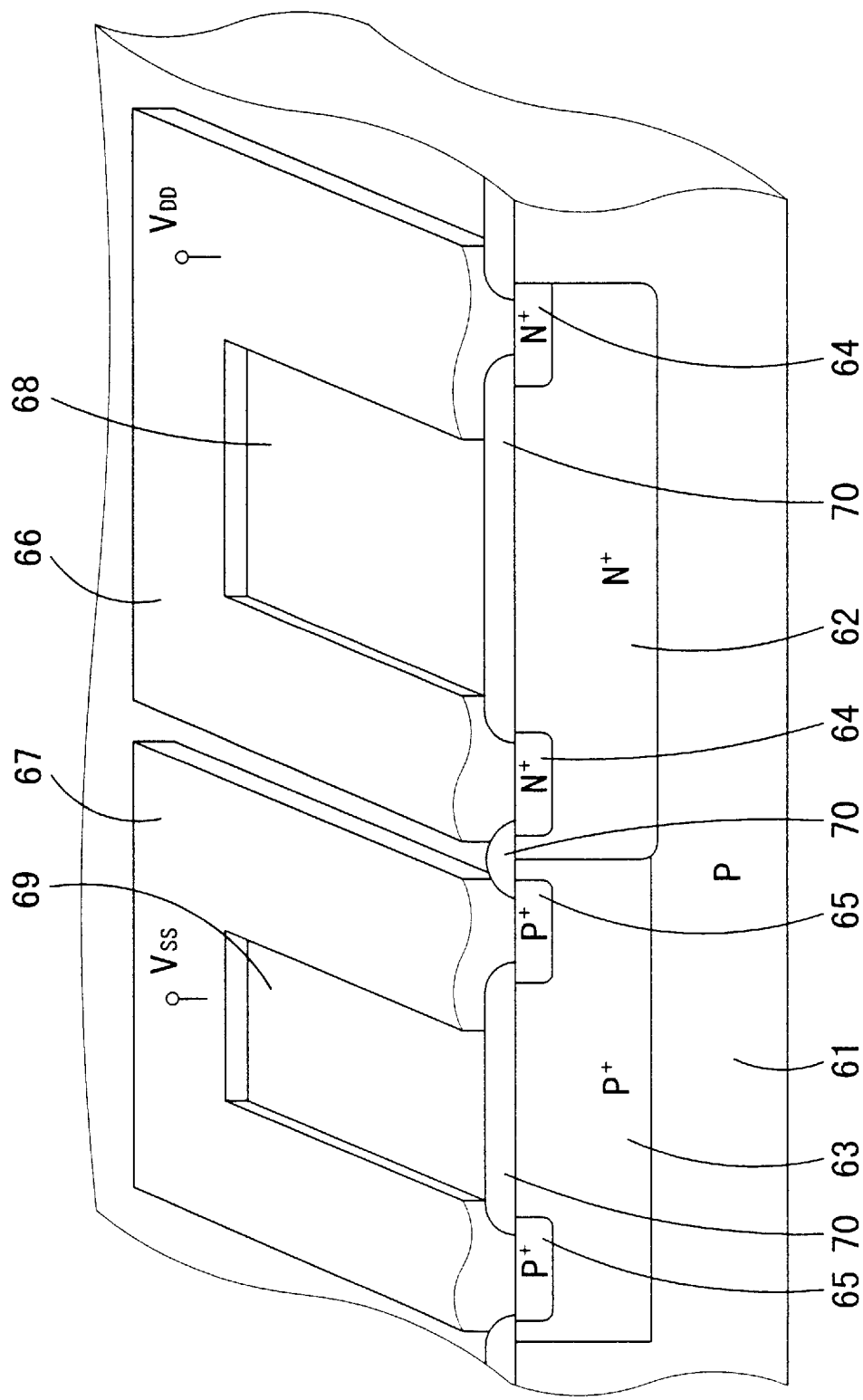
FIG. 10 is a perspective view showing the structure of the input/output cell.
Figure 11:
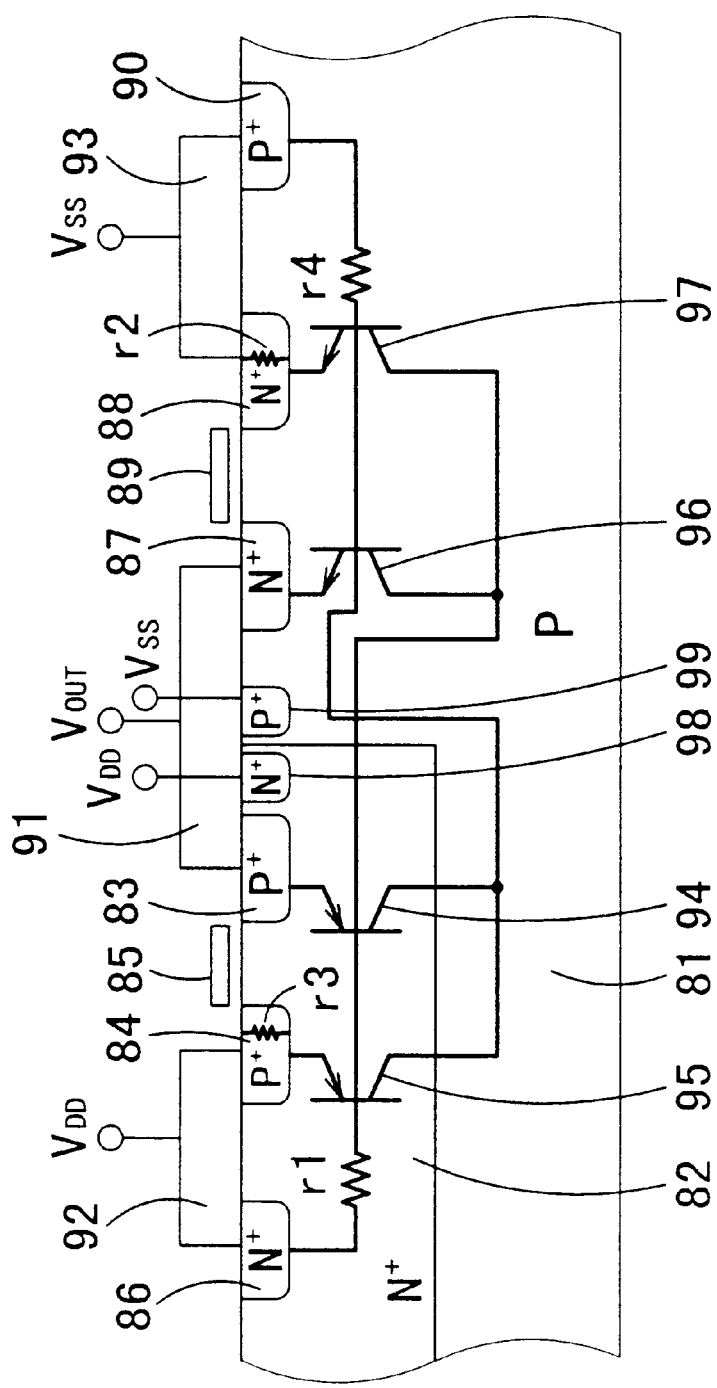
FIG. 11 is a cross-sectional view showing the structure of the input/output cell.
Figure 12:
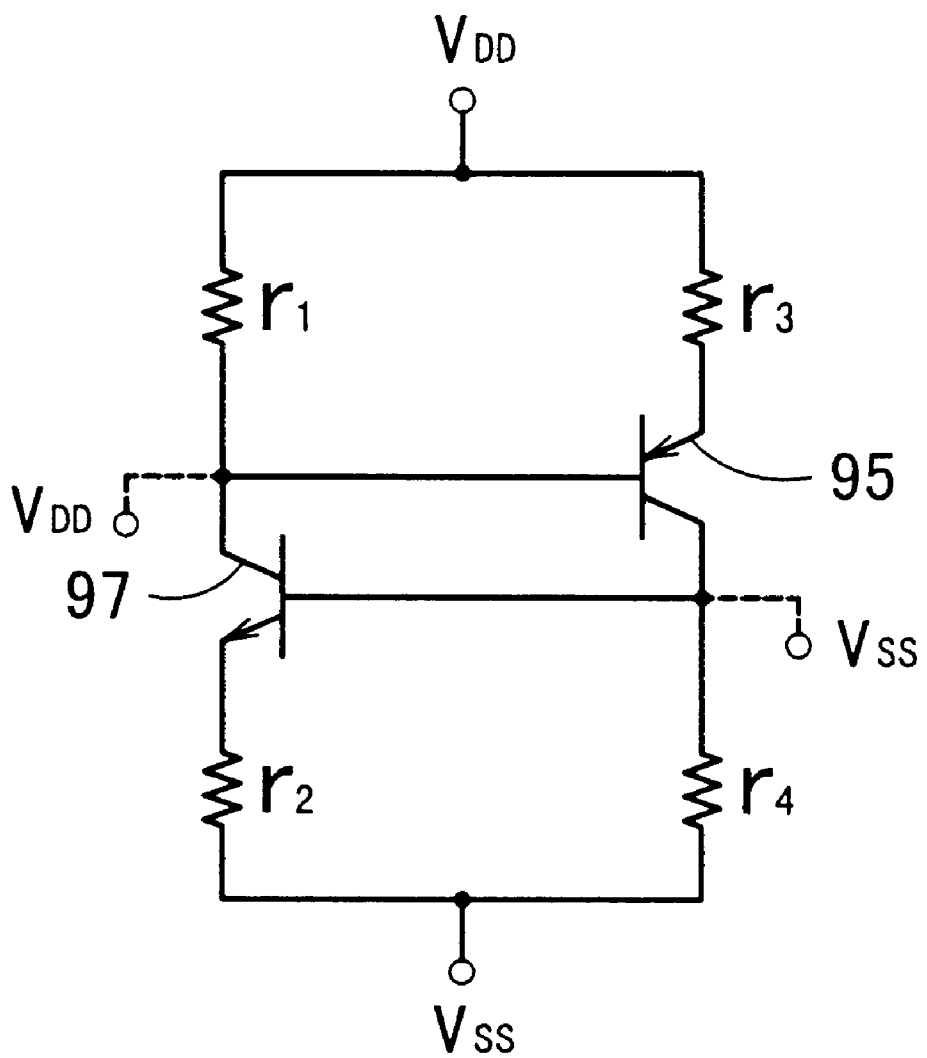
FIG. 12 is a circuit diagram showing the parasitic transistors 95 and 97 and the parasitic resistors $r_1$, $r_2$, $r_3$ and $r_4$ in the CMOS circuit of FIG. 11.

The layout of one input/output cell in FIG. 1 is as shown in FIG. 9. Conventionally, the input/output cells have been arranged around the internal logic circuit area 31 without any space. In this embodiment, however, as shown in FIG. 1, the space 42 is formed by arranging the inside input/output cells 11 at given intervals around the internal logic circuit area 31. Moreover, the given space 41 is formed between the outside input/output cells 21 and the inside input/output cells 11. The internal logic circuit area 31 is disposed inside the inside input/output cells 11 as mentioned above.

The wiring 51 for connecting the outside input/output cells 21 and the internal logic circuit area 31 is extended from the space 41 toward the space 42. The wiring 51 is connected to the internal logic circuit area 31 through the space 42.

Figure 7:
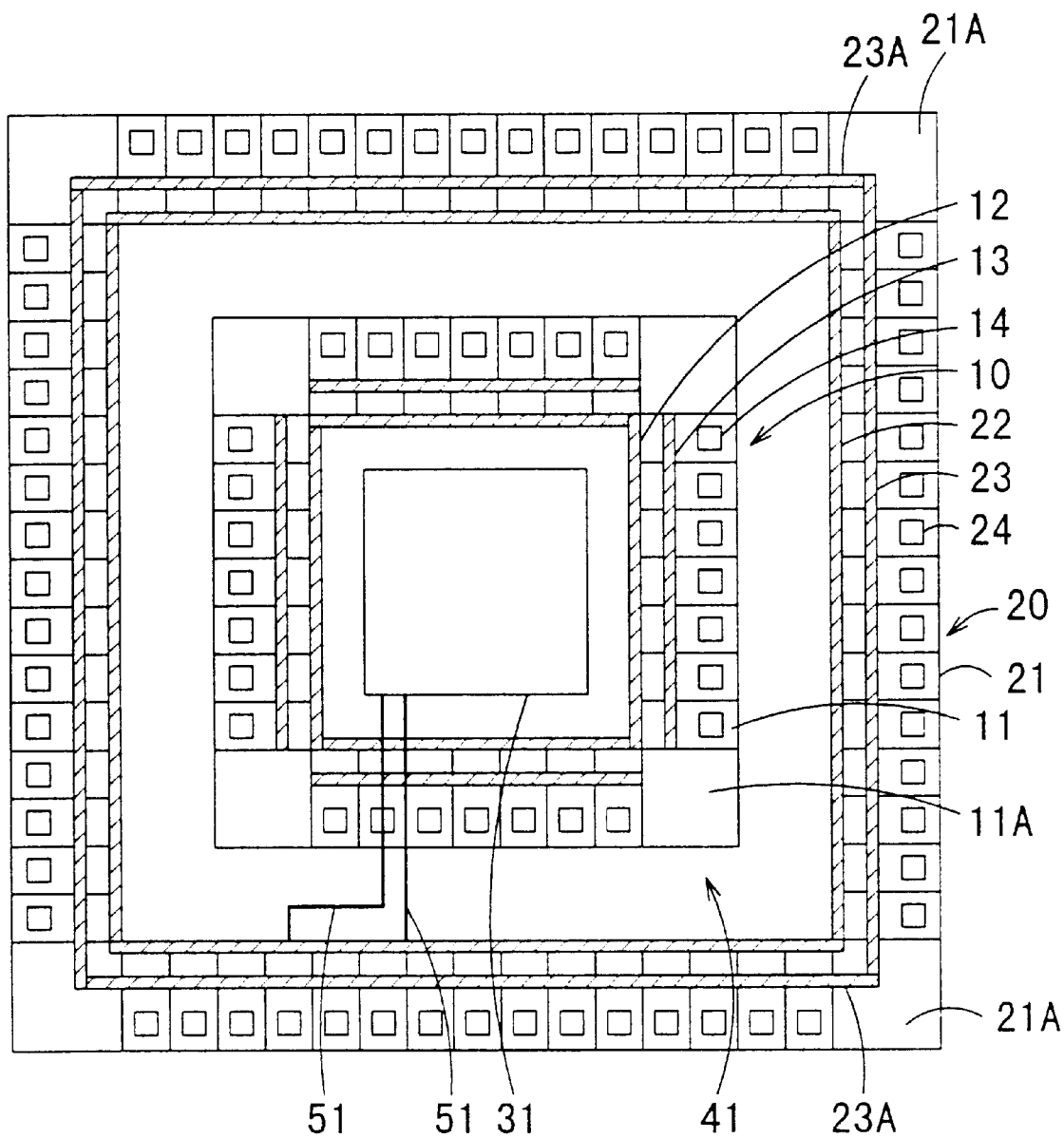
FIG. 7 is a schematic view showing the structure of the conventional semiconductor integrated circuit device.
Figure 8:
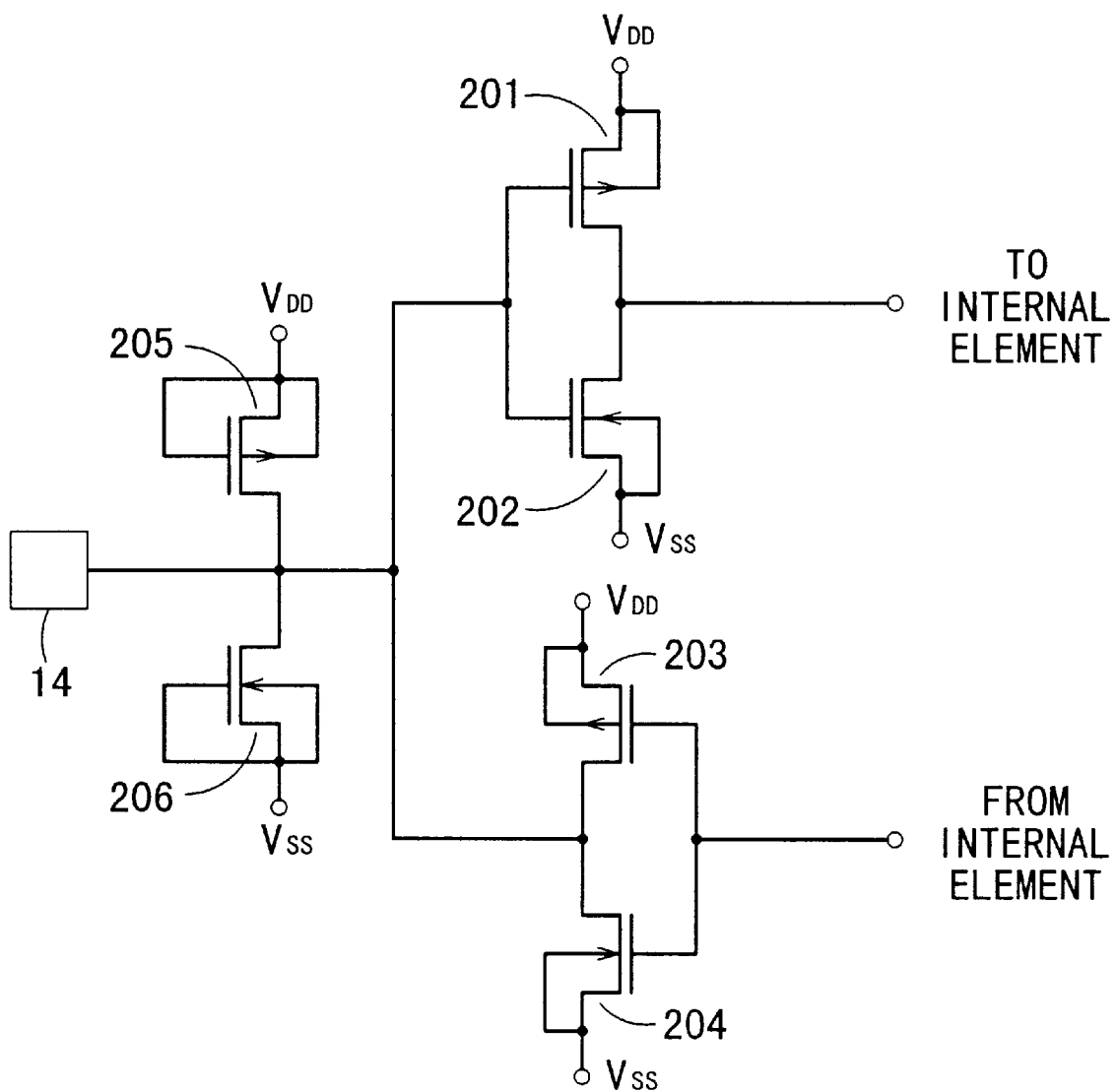
FIG. 8 is a view of the equivalent circuit of the input/output cells.

In a structure in which the input/output cells 11 of the inside input/output cell group 10 of FIG. 7 in the conventional example are merely arranged at arbitrary intervals to secure the space 42, the guard band rings for protecting the internal logic circuit area 31 is opened or cut, so that the protection is imperfect. In this embodiment, however, by forming in the space 42 the blank cells 15 each having the high potential side guard band 16 and the low potential side guard band 17 each comprising only a diffusion layer, the guard ring is not opened or cut. As a result, the function of protecting the internal logic circuit area 31 can be improved.

Figure 2:
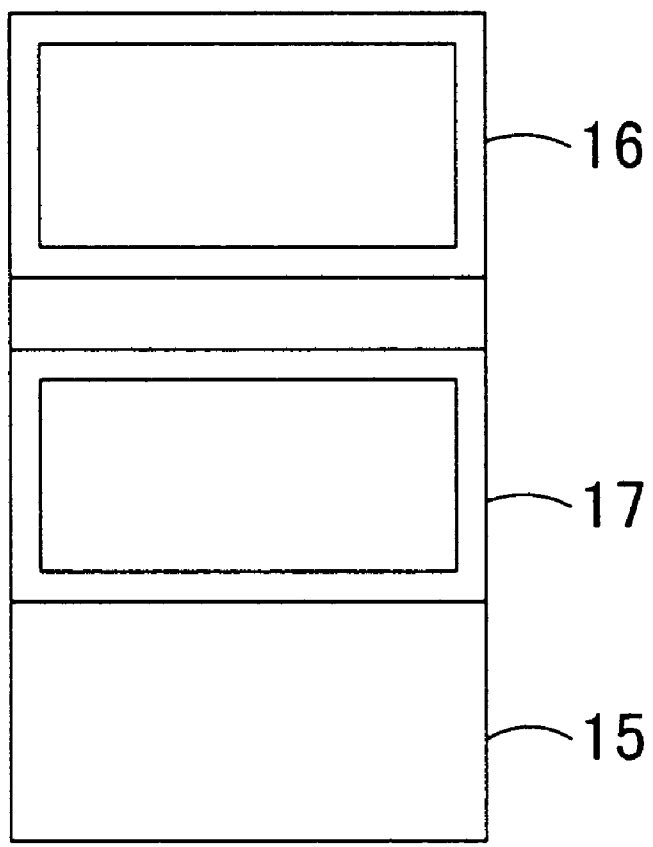
FIG. 2 is an enlarged view showing a detailed structure of the semiconductor integrated circuit device of FIG. 1.
Figure 3:
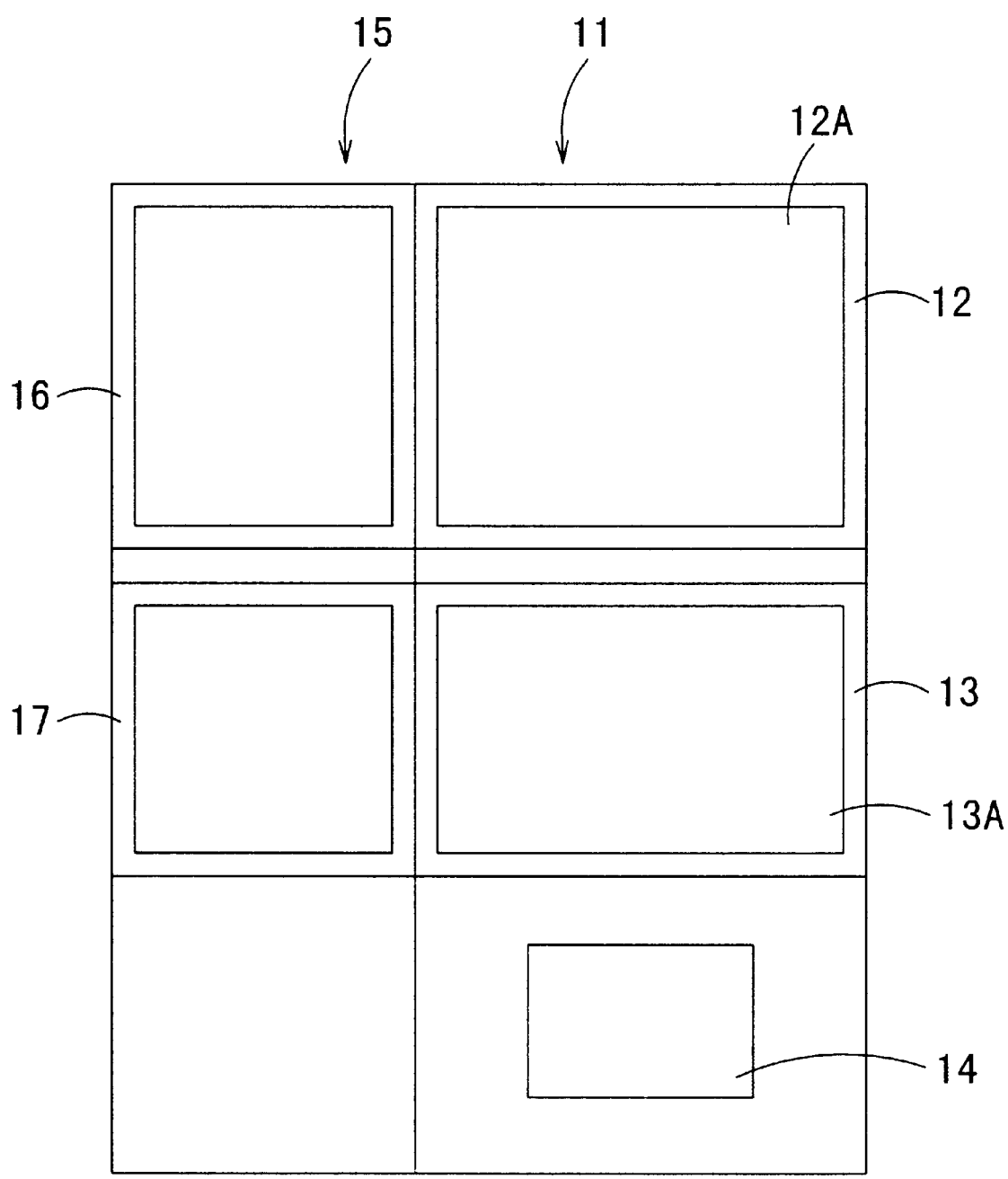
FIG. 3 is a schematic view showing the structure in the vicinity of the junction between an input/output cell and a blank cell.

A more detailed description will be given with reference to FIG. 2. In FIG. 2, only an N$^+$-type diffusion layer is formed on the high potential side guard band 16, and only a P$^+$-type diffusion layer is formed on the low potential side guard band 17. Consequently, as shown in FIG. 3, the high potential side guard bands 12 and the low potential side guard bands 13 of the input/output cells 11 and the high potential side guard bands 16 and the low potential side guard bands 17 of the blank cells 15 are electrically connected. As a result, as shown in FIG. 1, the guard bands form closed rings for the internal logic circuit area 31.

The high potential side guard band 12 and the low potential side guard band 13 of the input/output cell 11 and the high potential side guard band 16 and the low potential side guard band 17 of the blank cell 15 are electrically connected in the vicinity of the junction therebetween, for example, by a contact (not shown). The electrical connection may be achieved by joining the diffusion layers of the high potential side guard band 12 and the high potential side guard band 16 and joining the diffusion layers of the low potential side guard band 13 and the low potential side guard band 17.

Figure 4:
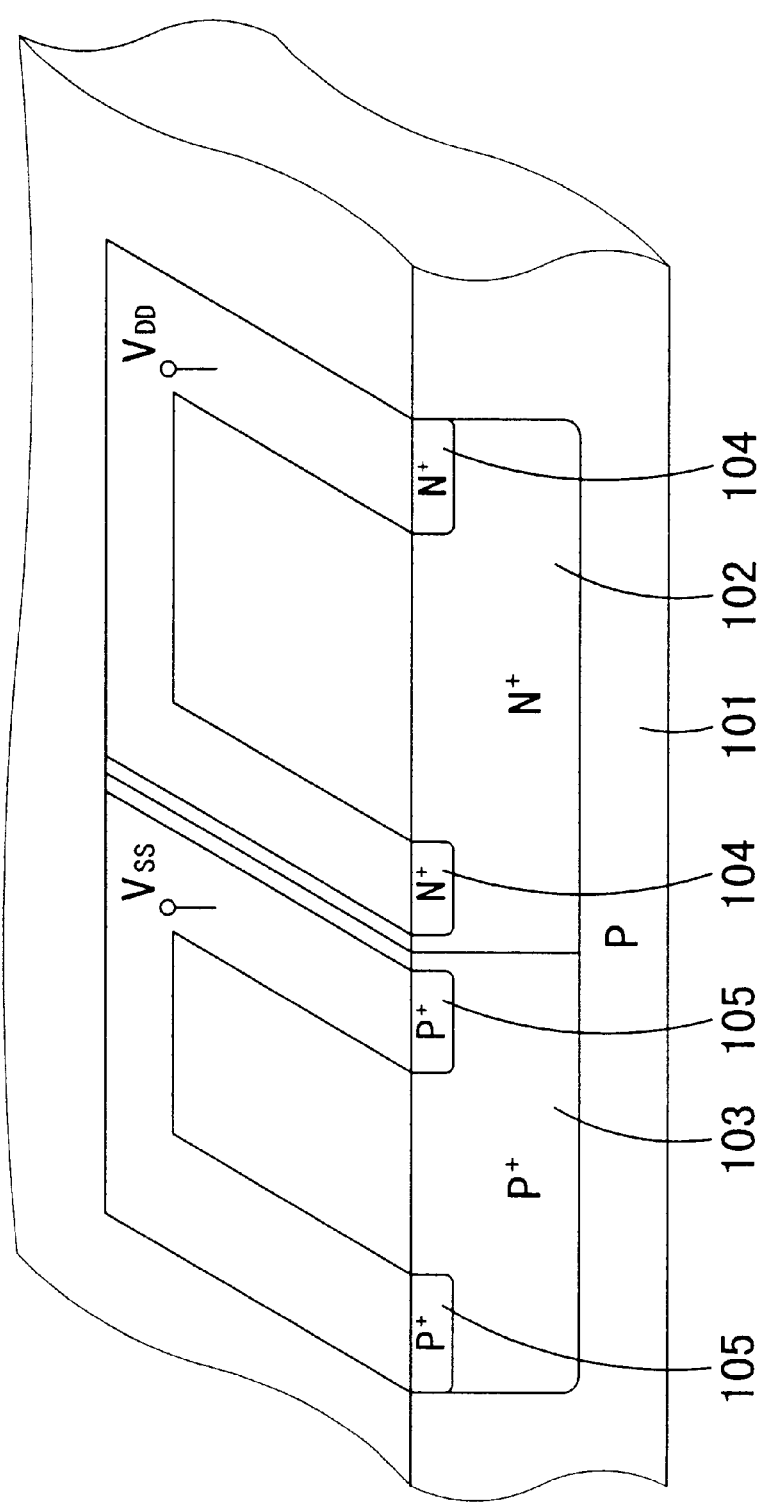
FIG. 4 is a perspective view showing the structure of the blank cell.

An example of a cross-sectional structure of the blank cell 15 will be described with reference to FIG. 4. In the blank cell 15, as shown in FIG. 4, an N$^+$-type well 102 and a P$^+$-type well 103 are formed in the P-type semiconductor substrate 101. In a peripheral part of the N$^+$-type well 102, a diffusion layer 104 for the high potential side guard band is formed in a square loop. In a peripheral part of the P-type well 103, a diffusion layer 105 for the low potential side guard band is formed in a square loop.

According to the semiconductor integrated circuit device of this embodiment, the wiring 51 for connecting the internal logic circuit area 31 and the outside input/output cells 21 can be provided through the spaces 41 and 42, so that the internal logic circuit area 31 and the outside input/output cells 21 can easily be connected. Moreover, guard rings that are not opened or cut are formed by the high potential side guard bands 12 and 16 and the low potential side guard bands 13 and 17, so that the capability of protecting the internal logic circuit area 31 can be improved. In addition, since the high potential side guard band 16 and the low potential side guard band 17 each comprise only a diffusion layer, the high potential side guard band 16 and the low potential side guard band 17 never interfere with the wiring 51 passing above the space 42.

While the guard band is provided in each of the inside and the outside input/output cell groups of a plurality of input/output cell groups in the above-described embodiment, when the internal logic circuit area 31 is formed only inside the inside input/output cell group, since the internal logic circuit area 31 is sufficiently protected by the guard band provided in the inside input/output cell group, the guard band in the outside input/output cell group can be omitted.

(Second Embodiment)

Figure 5:
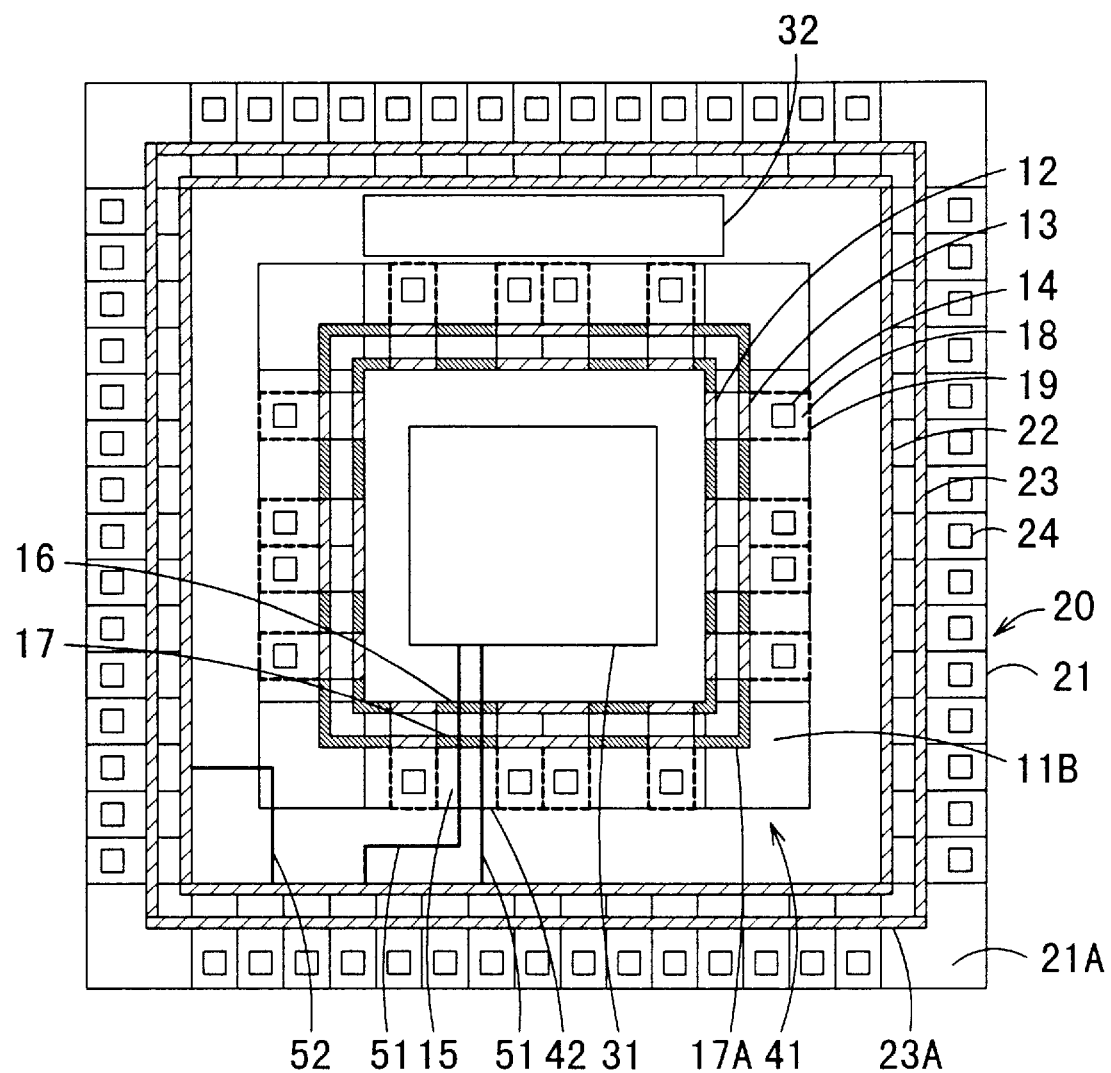
FIG. 5 is a schematic view showing the structure of a semiconductor integrated circuit device according to a second embodiment of the invention.

A semiconductor integrated circuit device according to a second embodiment of this invention will be described with reference to FIGS. 5 and 6. This semiconductor integrated circuit device uses input/output cells 18 instead of the input/output cells 11 of FIG. 1. Except this, the structure is the same as that of FIG. 1. In each input/output cell 18, the high potential side guard band 12 and the low potential side guard band 13 are provided on the internal logic circuit area 31 side of the bonding bad 14, and a low potential side guard band 19 is provided on the opposite side to the internal logic circuit area 31 side of the bonding pad 14. The low potential side guard band 19 is formed to surround the bonding pad 14, and has the two-layer structure of a diffusion layer and a metal layer.

A more detailed description will be given. In the semiconductor integrated circuit device, in a case where a second internal logic circuit area 32 is formed in the space 41 between the outside input/output cell group 20 and the inside input/output cell group 10, as shown in FIG. 6, the low potential side guard band 19 is previously formed also in a part below the bonding pad 14 in each input/output cell 18, that is, in a part situated outside when the cells 18 are arranged in a loop.

Figure 6:
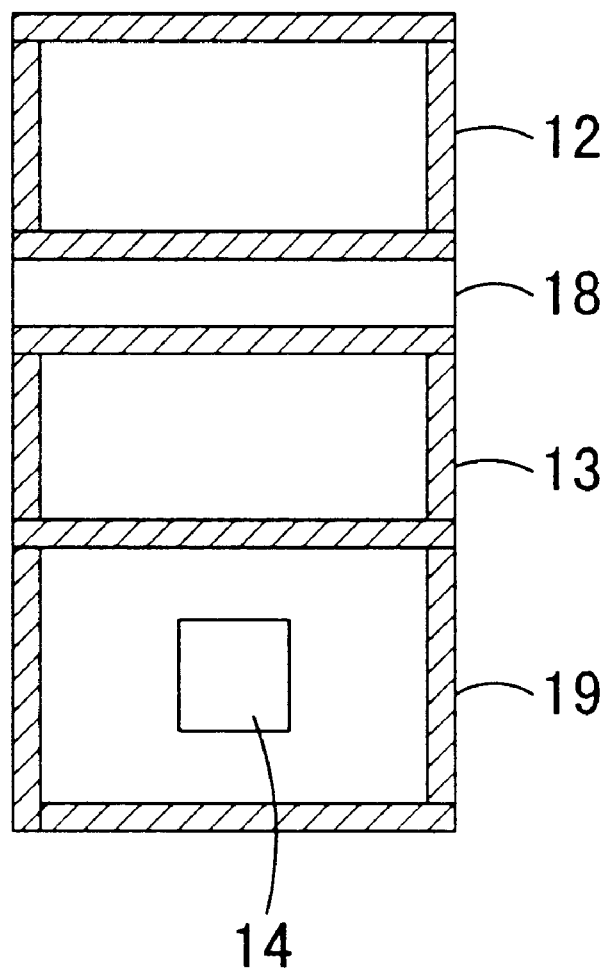
FIG. 6 is a schematic view showing the structure of a principal part of the semiconductor integrated circuit device according to the second embodiment of the invention.

Consequently, as shown in FIG. 6, the space 41 between the outside input/output cell group 20 and the inside input/output cell group 10 is surrounded by the low potential side guard bands 19, the guard rings formed by the high potential side guard bands 16 and the low potential side guard bands 17, and the guard rings formed by the high potential side guard bands 22 and the low potential side guard bands 23. Consequently, in the case where the second internal logic circuit area 32 is formed in the space 41, the internal logic circuit area 32 is protected from externally input signals. As a result, in the case where the second internal logic circuit area 32 is formed, the amount of latchup resistance of the semiconductor integrated circuit device improves and the noise resistance is excellent.

Moreover, since the high potential side guard band 16 and the low potential side guard band 17 each comprise only a diffusion layer in order to pass wiring therethrough, the resistance is high compared to connection by a metal which is a wiring layer. Therefore, by providing the low potential side guard band 19 between the bonding pad 14 of the inside input/output cell 11, and the high potential side guard band 16 and the low potential side guard band 17, latchup caused by a noise current flowing into the internal logic circuit area 31 can further be restrained.

While the input/output cells are arranged in two loops in the description given in this specification, three, four or more input/output cell groups may be provided so that the input/output cells are arranged in three, four or more loops.

What is claimed is:

1. A semiconductor integrated circuit device in which a plurality of input/output cell groups each comprising a plurality of input/output cells for performing signal transfer with an external device are each arranged in a loop so that an internal logic circuit area is surrounded by a plurality of loops, wherein a bonding pad for performing signal transfer with the external device is provided in each of the input/output cells of inside and outside input/output cell groups of the plurality of input/output cell groups, wherein first guard bands are disposed on an internal logic circuit area side of the bonding pad in each of the input/output cells of the inside input/output cell group, wherein said input/output cells of the inside input/output cell group are arranged in a condition where a first space for providing wiring between the internal logic circuit area and the input/output cells of the outside input/output cell group is provided, and wherein said inside input/output cell group and said outside input/output cell group are arranged in a condition where a second space for providing wiring between the internal logic circuit area and the input/output cells of the outside input/output cell group is provided.

2. A semiconductor integrated circuit device according to claim 1, wherein a blank cell having second guard bands each comprising only a diffusion layer is disposed in the first space, and wherein guard rings for the internal logic circuit area are formed by the first guard bands of the inside input/output cell group and the second guard bands.

3. A semiconductor integrated circuit device according to claim 1, wherein third guard bands are disposed on an internal logic circuit area side of the bonding pad in each of the input/output cells of the outside input/output cell group.

4. A semiconductor integrated circuit device according to claim 3, wherein a fourth guard band is provided on an opposite side to the internal logic circuit area side of the bonding pad in each of the input/output cells of the inside input/output cell group.

5. A semiconductor integrated circuit device according to claim 4, wherein said fourth guard band is formed so as to surround the bonding pad.

6. A semiconductor integrated circuit device according to claim 2, wherein third guard bands are disposed on an internal logic circuit area side of the bonding pad in each of the input/output cells of the outside input/output cell group.

7. A semiconductor integrated circuit device according to claim 6, wherein a fourth guard band is provided on an opposite side to the internal logic circuit area side of the bonding pad in each of the input/output cells of the inside input/output cell group.

8. A semiconductor integrated circuit device according to claim 7, wherein said fourth guard band is formed so as to surround the bonding pad.

* * * * *